ELECTRICAL CIRCUIT

Filed Sept. 29, 1959 2 Sheets-Sheet 1

WITNESSES

Leon J. Yaza

James G. Young

INVENTOR

Bobbie L. Thompson

BY

F. E. Browder

ATTORNEY

Oct. 24, 1961 B. L. THOMPSON 3,005,946

ELECTRICAL CIRCUIT

Filed Sept. 29, 1959 2 Sheets-Sheet 2

United States Patent Office 3,005,946

Patented Oct. 24, 1961

3,005,946

ELECTRICAL CIRCUIT

Bobbie L. Thompson, Penn Hills, Pa., assignor to Westinghouse Electric Corporation, East Pittsburgh, Pa., a corporation of Pennsylvania Filed Sept. 29, 1959, Ser. No. 843,296
12 Claims. (Cl. 323—24)

This invention relates to control circuits, and relates more particularly to control circuits for industrial power systems.

In many industrial power systems, regulated power is required. Often, the regulating elements of such systems require relatively large direct currents which are varied in response to control voltages. Among such elements are saturable reactors, D.C. generator field windings, etc. For supplying such relatively large currents, magnetic amplifiers are generally used, although electronic amplifiers have also been used.

This invention is a control system for an industrial power system which has many advantages over prior control systems which have used magnetic and electronic amplifiers. Among such advantages are that this control system uses less power, is more efficient, and requires less maintenance than prior systems using electronic amplifiers, and is simplier, less expensive, lighter, and easier to design than prior systems using magnetic amplifiers.

A feature of this invention is that it uses as a major element, a semiconductor switch. The semiconductor switch has three terminals and is composed mainly of four layers of semiconductive material, one more layer than the usual transistor has. The layers may, in the order named, be an emitter layer, a first base layer, a second base layer, and a layer of metal such as indium to serve as a source of minority carriers. The three terminals are connected to the emitter layer, the first base layer and to the indium layer, the latter terminal corresponding to the collector terminal of a transistor. The constructions of such semiconductor switches and their operating characteristics are disclosed in detail in the copending application of John Philips, Serial No. 649,038, filed March 28, 1957.

A semiconductor switch of the four region, three terminal, type has a characteristic such that when the proper voltages and currents are applied to its terminals, it will switch from a very high to a very low impedance. The action is similar to the gas thyratron tube except that the semiconductor switch in its switched or on condition presents a much lower impedance to the external circuit. If a reverse potential is applied between the indium terminal and the emitter terminal with no voltage applied to the base terminal, the semiconductor switch will be so resistive that up to a predetermined voltage less than a milliampere of current will flow. However, as the reverse voltage is increased, a breakdown voltage will be reached, and the semiconductor switch will suddenly become hyperconductive. By applying a small biasing potential to the base terminal, the hyperconductive condition can be made to occur at a lower reverse potential. The switching action can be initiated by allowing a very small base current to be drawn. Once the hyperconductive state has occurred, reverse current will flow without the application of further biasing current. In this invention, potentials less than breakdown potentials are applied to a semiconductor switch to ensure control of the switching by the base current.

An object of this invention is to improve control circuits for industrial power systems.

Another object of this invention is to use semiconductor switches in the control and power supply circuits of power regulators.

Another object of this invention is to use four region, three terminal, semiconductor switches in the control circuits of power regulators.

Another object of this invention is to use semiconductor switches in the power circuits of, and four region, three terminal, semiconductor switches in the control circuits of, power regulators.

Another object of this invention is to cause a control signal from a regulated load to turn on a four region, three terminal, semiconductor switch which turns on another semiconductor switch to supply power to the load.

This invention will now be described with reference to the annexed drawings, of which:

Figure 2:
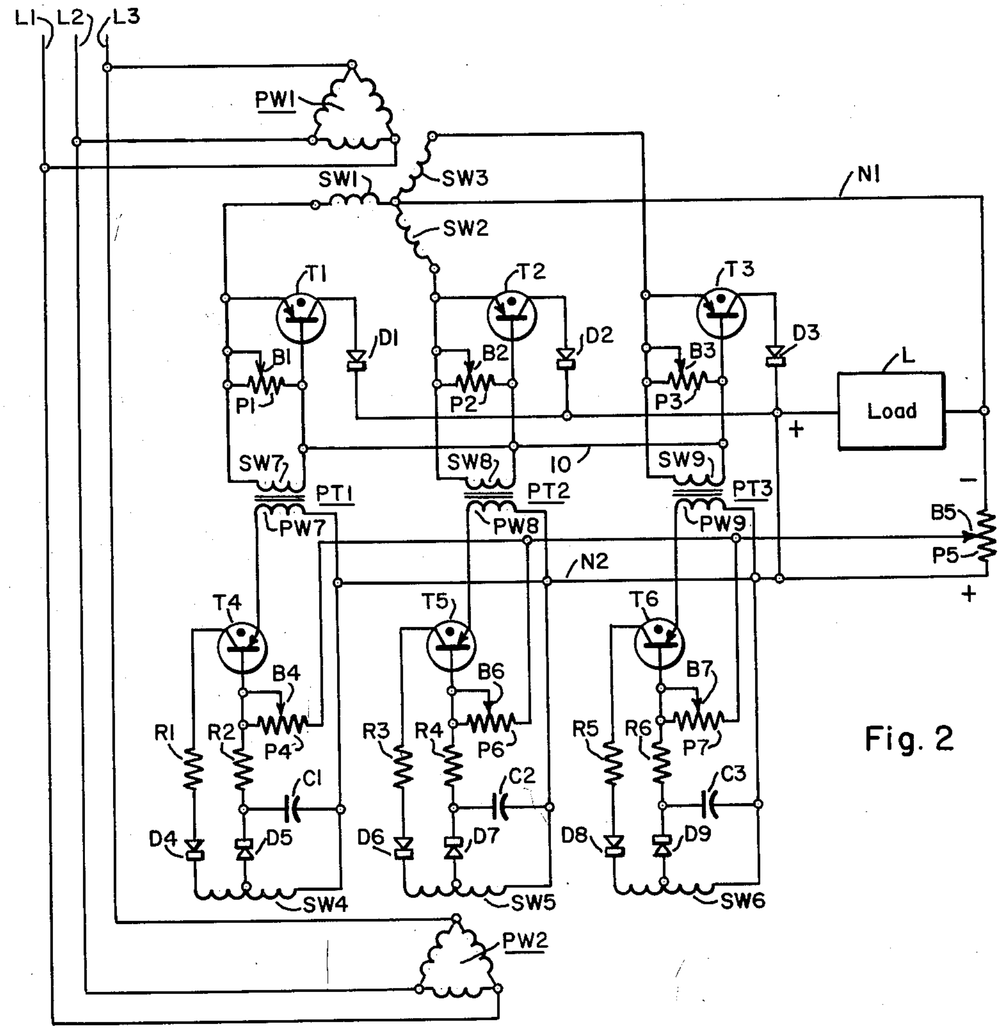
FIG. 2 is a simplified circuit schematic of one embodiment of this invention in which four region, three terminal, semiconductor switches are used in the power and control circuits.
Figure 3:
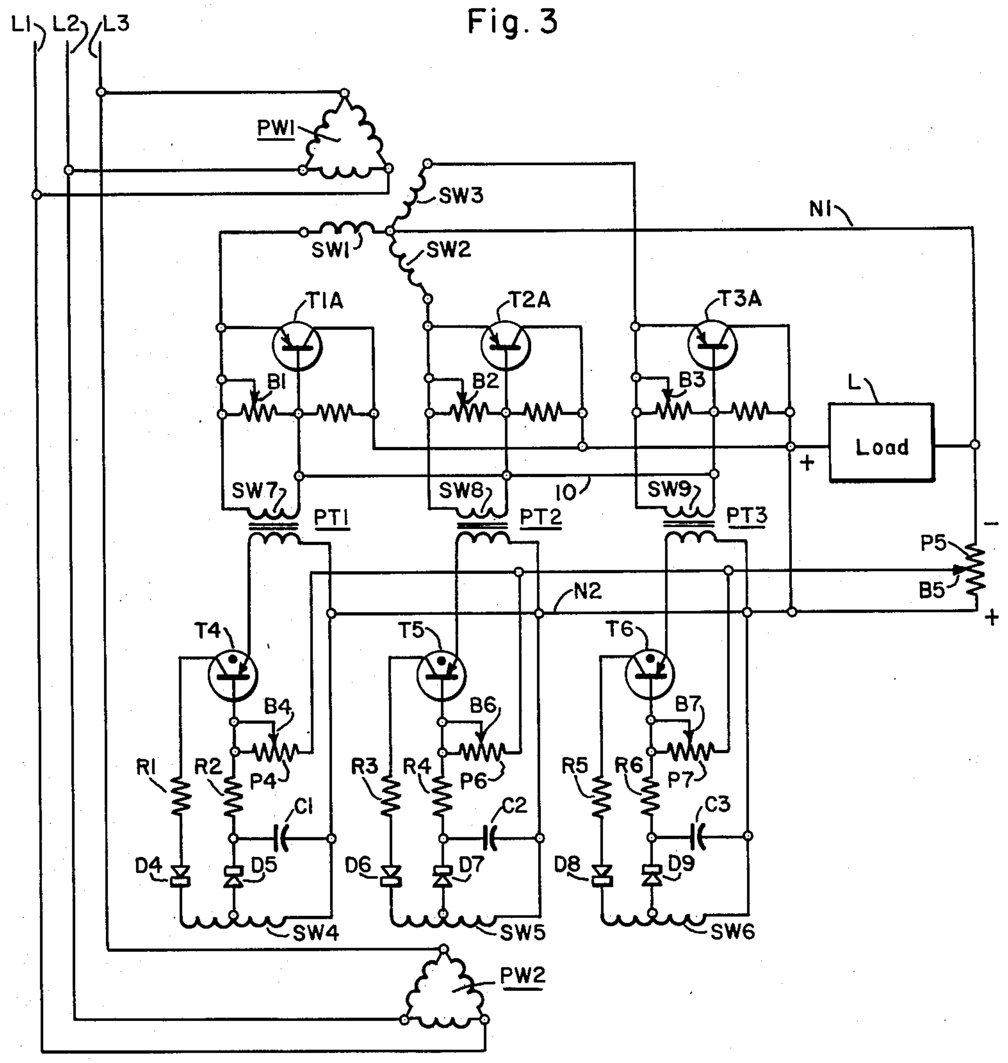
Figure 4:
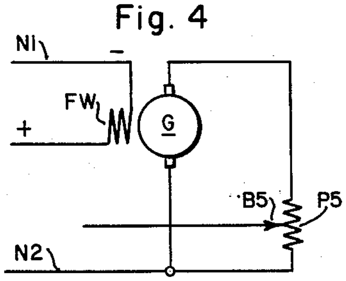

FIG. 3 is a simplified circuit schematic of another embodiment of this invention, similar to that of FIG. 2 except that the four region, three terminal, semiconductor switches in the power circuit are replaced by power transistors, and FIG. 4 shows how FIGS. 2 and 3 can be modified to have as a load regulator, the field winding of a D.C. generator, and to have the correction voltage taken from the generator output.

Figure 1:
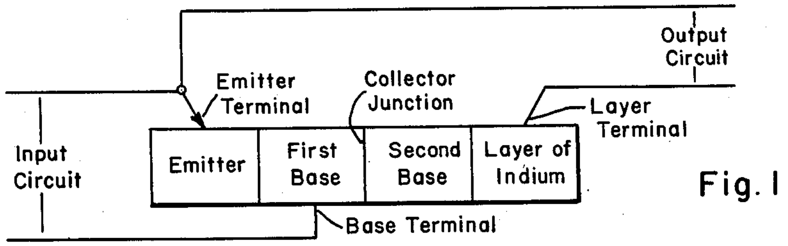
FIG. 1 is an enlarged, simplified, side view of a typical four region, three terminal, semiconductor switch, and its input and output connections.

Referring first to FIG. 1, a typical four region, three terminal, semiconductor switch there shown, has, in the order named, an emitter layer, a first base layer, a second base layer, and an outer layer of metal such as indium, formed as described in said application. It has three terminals, an emitter terminal, a first base terminal referred to hereafter as "base terminal," and a third terminal connected to the indium or outer layer, and referred to hereafter as "layer terminal." Its input circuit may be connected to its emitter and base terminals, and its output circuit may be connected to its emitter and layer terminals.

Referring now to FIG. 2, supply lines L1, L2 and L3 of a three-phase A.C. source which is not shown, are connected to primary winding PW1 of a three-phase transformer which has Y-connected secondary windings SW1, SW2 and SW3, with a neutral N1 connected to the junction of the latter, and to the negative terminal of a load L.

A first four region, three terminal, semiconductor switch T1 has its emitter terminal connected to the winding SW1 which also is connected to one end of a potentiometer P1, the other end and the brush B1 of which are connected to the base terminal of the four region, three terminal, semiconductor switch T1. The layer terminal of the four region, three terminal, semiconductor switch T1 is connected through a diode D1 to the positive terminal of the load L.

A second four region, three terminal, semiconductor switch T2 has its emitter terminal connected to the secondary winding SW2 which also is connected to one end of a potentiometer P2, the other end and the brush B2 of which are connected to the base terminal of the four region, three terminal, semiconductor switch T2. The layer terminal of the four region, three terminal, semiconductor switch T2 is connected through a diode D2 to the positive terminal of the load L.

A third four region, three terminal, semiconductor switch T3 has its emitter terminal connected to the winding SW3 which also is connected to one end of a potentiometer P3, the other end and the brush B3 of which are connected to the base terminal of the four region, three terminal, semiconductor switch T3. The layer terminal of the four region, three terminal, semiconductor switch T3 is connected through a diode D3 to the positive terminal of the load L.

The four region, three terminal, semiconductor switches T1, T2 and T3 serve as power rectifiers for supplying D.C. power to the load L when fired by the four region, three layer, semiconductor control switches T4, T5 and T6 as will be described in the following.

The power lines L1, L2 and L3 are also connected to primary winding PW2 of another three-phase transformer which has Y-connected secondary windings SW4, SW5 and SW6, with a neutral N2 connected to the junction of the latter, and to the positive terminal of the load L.

The first four region, three terminal, semiconductor control switch T4 has its emitter terminal connected to one end of primary winding PW7 of a pulse transformer PT1, the other end of the winding PW7 being connected to the neutral N2. The winding SW4 is connected through a resistor R1 and a diode D4 to the layer terminal of the four region, three terminal, semiconductor switch T4. The base terminal of the four region, three terminal, semiconductor switch T4 is connected through a resistor R2 and a diode D5 to the centertap of the secondary winding SW4; is connected through a capacitor C1 to the neutral N2, and is connected through a potentiometer P4 to brush B5 of control potentiometer P5.

A second four region, three terminal, semiconductor control switch T5 has its emitter terminal connected to one end of primary winding PW8 of a pulse transformer PT2, the other end of the winding PW8 being connected to the neutral N2. The winding SW5 is connected through a resistor R3 and a diode D6 to the layer terminal of the four region, three terminal, semiconductor switch T5. The base terminal of the four region, three terminal, semiconductor switch T5 is connected through a resistor R4 and a diode D7 to the centertap of the secondary winding SW5; is connected through a capacitor C2 to the neutral N2, and is connected through potentiometer P6 to the brush B5 of the control potentiometer P5. The potentiometer P6 has a brush B6 connected to the base of the four region, three terminal, semiconductor switch T5.

A third four region, three terminal, semiconductor control switch T6 has its emitter terminal connected to one end of primary winding PW9 of a pulse transformer PT3, the other end of the winding PW9 being connected to the neutral N2. The winding SW6 is connected through a resistor R5 and a diode D8 to the layer terminal of the four region, three terminal, semiconductor switch T6. The base terminal of the four region, three terminal, semiconductor switch T6 is connected through a resistor R6 and a diode D9 to the centertap of the secondary winding SW6; is connected through a capacitor C3 to the neutral N2, and is connected through a potentiometer P7 to the brush B5 of the control potentiometer P5. The potentiometer P7 has a brush B7 connected to the base of the four region, three terminal, semiconductor switch T6.

The control potentiometer is connected across the load L so as to develop a control voltage which is proportional to the current flowing through the load to be regulated.

The diodes D1, D2, D3, D4, D6 and D8 are blocking diodes for limiting the reverse voltage applied to the four region, three terminal, semiconductor switches T1, T2, T3, T4, T5 and T6 respectively, which do not have usable reverse current characteristics. The resistors R1, R3 and R5 are current limiting resistors. The potentiometers P1—P4, P6 and P7 are used to permit the use of replacement four region, three terminal, semiconductor switches having different characteristics.

A D.C. voltage is applied to the base of the four region, three terminal, control semiconductor switch T4 which is positive with respect to its emitter. This maintains the control switch T4 in its off or high impedance state. This voltage is derived from the capacitor C1 which is charged by the diode D5 during alternate half-cycles of current in the secondary winding SW4. The capacitor C1 discharges slowly through the resistor R2 and the potentiometers P4 and P5 during the other half-cycles. This base to emitter voltage of the control switch T4 is opposed by the control voltage taken from the brush B5 of the control potentiometer P5 and applied through the potentiometer P4 to the base of the control switch T4, the emitter of the latter being connected through the winding PW7 and the neutral N2 to the control potentiometer P5.

When the voltage from the capacitor C1 is equal to or is very slightly less than the control voltage, base current will be drawn by the control switch T4, and the latter will fire or switch. This will cause pulses of voltage to be developed in the primary and secondary windings PW7 and SW7 respectively, of the pulse transformer PT1, the pulses developed in the secondary winding SW7 being applied to the emitter of the four region, three terminal, semiconductor switch T1, causing the latter to fire or switch, and to supply a heavy direct current to the load L.

A D.C. voltage is applied to the base of the four region, three terminal, semiconductor control switch T5 which is positive with respect to its emitter. This maintains the control switch T5 in its off state. This voltage is derived from the capacitor C2 which is charged by the diode D7 during alternate half-cycles of the current flowing through the secondary winding SW5. The capacitor C2 discharges slowly through the resistor R4 and the potentiometers P6 and P5 during the other half-cycles. This base to emitter voltage of the control switch T5 is opposed by the control voltage taken from the brush B5 of the control potentiometer P5, and applied through the potentiometer P6 to the base of the control switch T5, the emitter of the latter being connected through the winding PW8 and the neutral N2 to the control potentiometer P5.

When the voltage from the capacitor C2 is equal to or is very slightly less than the control voltage, base current will be drawn by the control switch T5, and the latter will fire. This will cause voltage pulses to be developed in the primary and secondary windings PW8 and SW8 respectively, of the pulse transformer PT2, the pulses developed in the secondary winding SW8 being applied to the emitter of the four region, three terminal, semiconductor switch T2, causing the latter to fire, and to supply a heavy direct current to the load L.

A D.C. voltage is applied to the base of the four region, three terminal, semiconductor control switch T6 which is positive with respect to its emitter. This maintains the control switch T6 in its off state. This voltage is derived from the capacitor C3 which is charged by the diode D9 during alternate halfcycles of the current flowing through the secondary winding SW6. The capacitor C3 discharges slowly through the resistor R6 and the potentiometers P7 and P5 during the other half-cycles. This base to emitter voltage of the control switch T6 is opposed by the control voltage taken from the brush B5 of the control potentiometer P5, and applied through the potentiometer P7 to the base of the control switch T6, the emitter of the latter being connected through the winding PW9 and the neutral N2 to the control potentiometer P5.

When the voltage from the capacitor C3 is equal to or is slightly less than the control voltage, base current will be drawn by the control switch T6, and the latter will fire. This will cause voltage pulses to be developed in the primary and secondary windings PW9 and SW9 respectively, of the pulse transformer PT3, the pulses developed in the secondary winding SW9 being applied to the emitter of the four region, three terminal, semiconductor switch T3, causing the latter to fire and to supply a heavy direct current to the load L.

Thus, a phase rotation takes place, the power four region, three terminal, semiconductor switches T1, T2 and T3 are fired in succession to supply current to the load L when the control voltage calls for the supply of such current. Because of the fact that a four region, three terminal, semiconductor switch will fire or switch in a few millimicroseconds, the firing angles of the power four region, three terminal, semiconductor switches T1, T2 and T3 are very closely controlled over almost entire halfcycles of the A.C. supply. Variations in the control voltage across the control potentiometer P5 will vary the firing angles of the four region, three terminal, semiconductor switches, thus controlling the average power to the load L.

FIG. 3 of the drawings is an embodiment of this invention similar to that of FIG. 2 except that the four region, three terminal, semiconductor power switches T1, T2 and T3 of FIG. 1 are replaced by power transistors T1A, T2A and T3A respectively. Since the transistors have good reverse current characteristics, the blocking diodes D1, D2 and D3 are not used. Bias resistors R7, R8 and R9 are connected between the base and collector electrodes of the transistors T1A, T2A and T3A respectively. Otherwise, the circuit of FIG. 3 is similar to that of FIG. 2 and operates in the same manner.

The load L in FIGS. 1 and 2 may be a regulator such as a saturable reactor or a D.C. generator field winding for a main load to be regulated, and the control voltage across the control potentiometer P5 may be derived from the main load.

FIG. 4 of the drawings shows a D.C. generator G having a field winding FW which may be the load L of FIGS. 1 and 2. In FIG. 3, the control potentiometer P5 instead of being connected across the load L as shown by FIGS. 1 and 2, is connected to the generator G so as to have the output voltage of the generator applied thereacross. In the operation of FIG. 4, variations in the output voltage of the generator G would be applied to the bases and emitters of the four region, three terminal, semiconductor switches T4, T5 and T6 for causing the four region, three terminal, semiconductor power switches T1, T2 and T3 of FIG. 1 or the power transistors T1A, T2A and T3A of FIG. 2, to supply direct curent to the field winding FW to correct for the output voltage variations of the generator G.

What is claimed is:

1. A load regulating circuit comprising a power semiconductor switch having three terminals, a load, a first transformer having a secondary winding connected in series with said load and two of said terminals, a pulse transformer having a secondary winding connected to the third of said terminals and to one of said two terminals, said pulse transformer having a primary winding, a control semiconductor switch having three terminals, a second transformer having a secondary winding connected in series with said primary winding of said pulse transformer and two of said terminals of said control switch, a capacitor, means including a rectifier for charging said capacitor from said secondary winding of said second transformer, means for leaking the charge from said capacitor, means connecting said capacitor to the third terminal and to one of said two terminals of said control switch, and a source of control voltage connected to said third terminal and to one of said two terminals of said control switch.

2. A load regulating circuit comprising a first transformer having a multi-phase secondary winding and having a neutral, a power semiconductor switch for each phase of said winding, each of said switches having three terminals, a load, means connecting said load to said neutral and in series with each phase of said winding and two of said terminals of the corresponding one of said switches, a plurality of pulse transformers, one for each of said phases, each of said pulse transformers having a secondary winding connected to the third terminal and to one of said two terminals of the corresponding one of said switches, said pulse transformers having primary windings, a second transformer having a secondary winding with the same number of phases as said secondary winding of said first transformer, and having a second neutral, a control semiconductor switch for each of said phases, each of said control switches having three terminals, means connecting each of said phases of said secondary winding of said second transformer in series with the primary winding of the corresponding one of said pulse transformers and two of said terminals of the corresponding one of said control switches, a capacitor for each of said control switches, means including a rectifier for charging each of said capacitors from the corresponding one of said phases of said secondary winding of said second transformer, means for leaking the charges from said capacitors, means connecting each of said capacitors to the third terminal and to one of the two terminals of the corresponding one of said control switches, a source of control voltage, and means including said second neutral connecting said source to the third terminal and to one of the two terminals of each of said control switches.

3. A load regulating circuit comprising a power semiconductor switch having an input circuit and an output circuit, a load, a transformer having a secondary winding connected in series with said load and said output circuit, a semiconductor control switch having an input circuit and having an output circuit, a second transformer having a secondary winding connected to said output circuit of said semiconductor control switch, means coupling said output circuit of said semiconductor control switch to said input circuit of said switch, a capacitor, means including a diode for charging said capacitor from said secondary winding of said second transformer, means for leaking the charge from said capacitor, a control voltage source, and means connecting said capacitor and said source to said input circuit of said semiconductor control switch.

4. A load regulating circuit comprising a first transformer having a multi-phase secondary winding and having a first neutral, a power semiconductor switch for each phase of said winding, each of said power semiconductor switches having an input circuit and an output circuit, a load, means connecting said load to said neutral and in series with each phase of said winding and said output circuit of the corresponding one of said switches, a semiconductor control switch for each of said phases, each of said semiconductor control switches having an input circuit and an output circuit, a second transformer having a secondary winding with the same number of phases as said secondary winding of said first transformer, means connecting each of the phases of said secondary winding of said second transformer to the output circuit of the corresponding one of said semiconductor control switches, means coupling the output circuit of each of said semiconductor control switches to the input circuit of the corresponding one of said switches, a capacitor for each of said semiconductor control switches, means including a rectifier for charging each of said capacitors from the corresponding phase of said secondary winding of said second transformer, means for leaking the charges from said capacitors, a control voltage source, and means including said second neutral connecting said voltage source to said input circuits of said semiconductor control switches, and each of said capacitors to the input circuit of the corresponding one of said semiconductor control switches.

5. A load regulating circuit comprising a power semiconductor switch having an input circuit and an output circuit, a load, a transformer having a secondary winding connected in series with said load and said output circuit, a semiconductor control switch having an input circuit and an output circuit, a second transformer having a secondary winding connected to said output circuit of said semiconductor control switch, means coupling said output circuit of said semiconductor control switch to said input circuit of said switch, a capacitor, means including a diode for charging said capacitor from said secondary winding of said second transformer, means for leaking the charge from said capacitor, means for deriving a control voltage from said load, and means connecting said capacitor and said last mentioned means to said input circuit of said semiconductor control switch.

6. A load regulating circuit comprising a first transformer having a multi-phase secondary winding and having a first neutral, a power semiconductor switch having an input circuit and an output circuit, for each phase of said winding, a load, means connecting said load to said neutral and in series with each phase of said winding and the output circuit of the corresponding one of said switches, a plurality of control semiconductor control switches, one for each of said phases, each of said semiconductor control switches having an input circuit and an output circuit, a second transformer having a secondary winding with the same number of phases as said secondary winding of said first transformer, means connecting each of said phases of said secondary winding of said second transformer to the output circuit of the corresponding one of said semiconductor control switches, means coupling the output circuit of each of said semiconductor control switches to the input circuit of the corresponding one of said switches, a capacitor for each of said semiconductor control switches, means including a diode for charging each of said capacitors from the corresponding phase of said secondary winding of said second transformer, means for leaking the charges from said capacitors, means deriving a control voltage from said load, and means connecting said last mentioned means to the input circuit of one of said semiconductor control switches and connecting each of said capacitors to the input circuit of the corresponding one of said semiconductor control switches.

7. A load regulating circuit comprising a power semiconductor switch having an input and an output circuit, a load, a load regulator for said load, a power transformer having a secondary winding connected in series with said regulator and said output circuit, a semiconductor control switch having an input and an output circuit, a second transformer having a secondary winding connected to said output circuit of said semiconductor control switch, means coupling said input circuit of said power semiconductor switch to said output circuit of said semiconductor control switch, a capacitor, means including a diode for charging said capacitor from said secondary winding of said second transformer, means for deriving a control voltage from said load, and means connecting said capacitor and said last mentioned means to said input circuit of said semiconductor control switch.

8. A load regulating circuit comprising a first transformer having a multi-phase secondary winding and having a first neutral, a power semiconductor switch having an input circuit and an output circuit, for each phase of said winding, a load, a regulator for said load, means connecting said regulator to said neutral and in series with each phase of said winding and the output circuit of the corresponding one of said switches, a plurality of semiconductor control switches, one for each of said phases, each of said semiconductor control switches having an input and an output circuit, a second transformer having a secondary winding with the same number of phases as said secondary winding of said first transformer and having a second neutral, means connecting each of said phases of said secondary winding of said second transformer to the output circuit of the corresponding one of said semiconductor control switches, means coupling the output circuit of each of said semiconductor control switches to the input circuit of the corresponding one of said power switches, a capacitor for each of said semiconductor control switches, means including a diode for charging each of said capacitors from the corresponding phase of said secondary winding of said second transformer, means for leaking the charges from said capacitors, means deriving a control voltage from said load, and means including said second neutral connecting said last mentioned means to said input circuits of said semiconductor control switches, and connecting each of said capacitors to the input circuit of the corresponding one of said semiconductor control switches.

9. A load regulating circuit comprising a power semiconductor switch having three terminals, a load, a first transformer having a secondary winding connected in series with said load and two of said terminals, a pulse transformer having a secondary winding connected to the third of said terminals and to one of said two terminals, said pulse transformer having a primary winding, a semiconductor control switch having three terminals, a second transformer having a secondary winding connected in series with said primary winding and two of said terminals of said semiconductor control switch, a capacitor, means including a diode connected to the center of said secondary winding of said second transformer for charging said capacitor, means for leaking the charge from said capacitor, a source of control voltage, and means connecting said source and said capacitor to the third terminal and to one of said two terminals of said semiconductor control switch.

10. A load regulating circuit comprising a first transformer having a multi-phase secondary winding and having a neutral, a power semiconductor switch for each phase of said winding, each of said power semiconductor switches having three terminals, a load, means connecting said load to said neutral and in series with two of said terminals of the corresponding one of said switches, a plurality of pulse transformers, one for each of said phases, each of said pulse transformers having a secondary winding connected to the third terminal and to one of the two terminals of the corresponding one of said switches, said pulse transformers having primary windings, a second transformer having a secondary winding with the same number of phases as said secondary winding of said first transformer, and having a second neutral, a plurality of semiconductor control switches, one for each of said phases, each of said semiconductor control switches having three terminals, means connecting each of said phases of said secondary winding of said second transformer in series with the primary winding of the corresponding one of said pulse transformers and two of said terminals of the corresponding one of said semiconductor control switches, a capacitor for each of said semiconductor control switches, means including a diode connected to the center of each of said phases of said secondary winding of said second transformer for charging the corresponding one of said capacitors, means for leaking the charges from said capacitors, a source of control voltage, and means including said second neutral connecting said source to the third terminal and one of the two terminals of each of said semiconductor control switches, and connecting each of said capacitors to the third terminal and to one of the two terminals of the corresponding one of said semiconductor control switches.

11. A load regulating circuit comprising a power semiconductor switch having three terminals, a load, a regulator winding for said load, a first transformer having a secondary winding connected in series with said regulator winding and two of said terminals, a pulse transformer having a secondary winding connected to the third of and to one of said two terminals, said pulse transformer having a primary winding, a control semiconductor control switch having three terminals, a second transformer having a secondary winding connected in series with said primary winding and two of said terminals of said semiconductor control switch, a capacitor, means including a diode connected to the center of said secondary winding of said second transformer for charging said capacitor during alternate half-cycles, means for leaking the charge from said capacitor during the other half-cycles, means deriving a control voltage from said load, and means connecting said last mentioned means and said capacitor to the third terminal and to one of said two terminals of said semiconductor control switch.

12. A load regulating circuit comprising a first transformer having a multi-phase secondary winding and having a first neutral, a power semiconductor switch having three terminals, for each phase of said winding, a load, a regulator winding for said load, means connecting said regulator winding to said neutral and in series with two of the terminals of the corresponding one of said switches, a plurality of pulse transformers, one for each of said switches, each of said pulse transformers having a secondary winding connected to the third terminal and to one of said two terminals of the corresponding one of said switches, said pulse transformers having primary windings, a second transformer having the same number of phases as said secondary winding of said first transformer, and having a second neutral, a plurality of semiconductor control switches, one for each of said phases, each of said semiconductor control switches having three terminals, means connecting each of said phases of said secondary winding of said second transformer in series with the primary winding of the corresponding one of said pulse transformers and two of the terminals of the corresponding one of said semiconductor control switches, a capacitor for each of said semiconductor control switches, means including a diode connected to the center of each of said phases of said secondary winding of said second transformer for charging the corresponding one of said capacitors during alternate half-cycles of the corresponding one of its phases, means for leaking the charges from each of said capacitors during the other half-cycles of the corresponding ones of its phases, means deriving a control voltage from said load, and means including said second neutral connecting said last mentioned means to the third terminal and to one of said two terminals of each of said semiconductor control switches, and connecting each of said capacitors to the third electrode and to one of said two electrodes of the corresponding one of said semiconductor control switches.

References Cited in the file of this patent

UNITED STATES PATENTS

| | | |
|---|---|---|
| 2,421,995 | Cooper | June 10, 1947 |
| 2,438,831 | Sziklac | Mar. 30, 1948 |